US007369663B2

(12) United States Patent
Sekine

(10) Patent No.: US 7,369,663 B2
(45) Date of Patent: May 6, 2008

(54) METHOD OF CREATING REVERBERATION BY ESTIMATION OF IMPULSE RESPONSE

(75) Inventor: Satoshi Sekine, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 650 days.

(21) Appl. No.: 10/424,045

(22) Filed: Apr. 25, 2003

(65) Prior Publication Data

US 2003/0202667 A1 Oct. 30, 2003

(30) Foreign Application Priority Data

Apr. 26, 2002 (JP) ............................ 2002-126739

(51) Int. Cl.
*H03G 3/00* (2006.01)
*G10H 1/02* (2006.01)
*G10H 7/00* (2006.01)

(52) U.S. Cl. ............................ 381/63; 381/61; 84/630; 84/707

(58) Field of Classification Search .................. 84/630, 84/707, DIG. 26; 381/63, 61
See application file for complete search history.

(56) References Cited

U.S. PATENT DOCUMENTS 5,025,472 A 6/1991 Shimizu et al.
5,317,104 A 5/1994 Frost
5,452,360 A 9/1995 Yamashita et al.
5,467,401 A * 11/1995 Nagamitsu et al. ........... 381/63
5,771,294 A 6/1998 Inoue et al.

FOREIGN PATENT DOCUMENTS

| | | |
|---|---|---|
| EP | 0 593 228 A1 | 10/1993 |
| JP | 5046193 | 2/1993 |
| JP | 6110484 | 4/1994 |
| JP | 6266379 | 9/1994 |
| JP | 09-166482 | 6/1997 |
| JP | 2001-125578 | 5/2001 |

* cited by examiner

*Primary Examiner*—Xu Mei
*Assistant Examiner*—Douglas Suthers
(74) *Attorney, Agent, or Firm*—Morrison & Foerster LLP

(57) ABSTRACT

The present invention is directed to creating sound reverberation. In accordance with a preferred embodiment, an apparatus estimates an impulse response for use in reproduction of a sound in a desired acoustic space. In particular, the apparatus collects space information concerning an acoustic space and point information indicating positions of a sound generation and reception points in the acoustic space, estimates a set of acoustic ray paths of the sound traveling from the sound generation point to the sound reception point, acquires directivity information indicating an acoustic directivity of the sound generation point and the sound reception point, estimates an acoustic intensity of each acoustic ray path and weights each acoustic intensity by the acquired directivity information, and determines the impulse response based on directions of the respective acoustic ray paths toward the sound reception point and the weighed acoustic intensities of the respective acoustic ray paths.

12 Claims, 11 Drawing Sheets

RF

| | |
|---|---|
| ACOUSTIC SPACE | XXX CONCERT HALL |
| TYPE OF SOUND GENERATION POINT | TRUMPET |
| ARRANGEMENT POSITION OF SOUND GENERATION POINT | (Xs, Ys, Zs) |
| DIRECTION OF SOUND GENERATION POINT | (Xsd, Ysd, Zsd) |
| TYPE OF SOUND RECEPTION POINT | HUMAN BEING |
| ARRANGEMENT POSITION OF SOUND RECEPTION POINT | (XR, YR, ZR) |
| DIRECTION OF SOUND RECEPTION POINT | (XRd, YRd, ZRd) |

FIG.4

RF

| | |
|---|---|
| ACOUSTIC SPACE | XXX CONCERT HALL |
| TYPE OF SOUND GENERATION POINT | TRUMPET |
| ARRANGEMENT POSITION OF SOUND GENERATION POINT | $(X_s, Y_s, Z_s)$ |
| DIRECTION OF SOUND GENERATION POINT | $(X_{sd}, Y_{sd}, Z_{sd})$ |
| TYPE OF SOUND RECEPTION POINT | HUMAN BEING |
| ARRANGEMENT POSITION OF SOUND RECEPTION POINT | $(X_R, Y_R, Z_R)$ |
| DIRECTION OF SOUND RECEPTION POINT | $(X_{Rd}, Y_{Rd}, Z_{Rd})$ |

FIG.6

TBL1

| SOUND RAY PATH LENGTH | REFLECTION DIRECTION | ARRIVAL DIRECTION | REFLECTION FREQUENCE | REFLECTION ATTENUATION RATE |
|---|---|---|---|---|
| $L_1$ | $(X_{r1}, Y_{r1}, Z_{r1})$ | $(X_{a1}, Y_{a1}, Z_{a1})$ | 1 | $d_1$ |
| $L_2$ | $(X_{r2}, Y_{r2}, Z_{r2})$ | $(X_{a2}, Y_{a2}, Z_{a2})$ | 2 | $d_2$ |
| ⋮ | ⋮ | ⋮ | ⋮ | ⋮ |

FIG.8

TBL2

| REVERBERATION DALAY TIME | COMPOSITE SOUND RAY INTENSITY | COMPOSITE ARRIVAL DIRECTION |
|---|---|---|
| 3msec | $I_{c1}$ | ($X_{c1}$, $Y_{c1}$, $Z_{c1}$) |
| 3.2msec | $I_{c2}$ | ($X_{c2}$, $Y_{c2}$, $Z_{c2}$) |
| ⋮ | ⋮ | ⋮ |

FIG.9

TBL2

| REVERBERATION DALAY TIME | COMPOSITE SOUND RAY INTENSITY | COMPOSITE ARRIVAL DIRECTION | REPRODUCTION CHANNEL INFORMATION |
|---|---|---|---|
| 3msec | $I_{c1}$ | $(X_{c1}, Y_{c1}, Z_{c1})$ | REPRODUCTION CHANNEL [1] |
| 3.2msec | $I_{c2}$ | $(X_{c2}, Y_{c2}, Z_{c2})$ | REPRODUCTION CHANNEL [3] |
| ⋮ | ⋮ | ⋮ | |

METHOD OF CREATING REVERBERATION BY ESTIMATION OF IMPULSE RESPONSE

BACKGROUND OF THE INVENTION

1. Technical Field of the Invention

The present invention relates to a reverberation applying apparatus, a reverberation applying method, an impulse response generation apparatus, an impulse response generation method, a reverberation applying program, an impulse response generation program, and a recording medium for applying a reverberation effect to an audio signal in order to reproduce musical performances and the like held in acoustic spaces such as an auditorium a concert hall, a theater, and the like.

2. Prior Art

In recent years, various technologies are proposed so that a user can listen to realistic music in his or her room (hereafter referred to as a listening room) at home as if he or she were enjoying live performance in a concert hall or theater. One example is the acoustic field reproduction technology that reproduces acoustic fields of a virtual acoustic space such as a public concert hall in an actual acoustic space such as a private listening room.

The acoustic field reproduction technology will now be described. FIG. 11 schematically shows how sounds are reflected in an acoustic space 90 when a sound generation point S such as a musical instrument generates a sound. As shown in FIG. 11, sounds generated from the sound generation point S on a stage 901 are reflected on boundary surfaces such as a ceiling and side walls in the acoustic space 90 and reach an auditorium 902. The reflected sounds reach the auditorium 902 not simultaneously, but with time delays dependently on diverse travel distances.

In FIG. 11, a listening room L is depicted in the auditorium 902. If acoustics of a direct sound or a reflected sound (i.e., reverberant sound) can be reproduced on boundary surfaces such as a ceiling and walls in the listening room L, the listening room L can reproduce the acoustic field of the auditorium 902 enclosed in the listening room L. Generally, the reproduction of acoustics uses a reverberation applying apparatus that performs a convolution operation for an audio signal and an impulse response in the acoustic space for output. The impulse response is derived by using an acoustic signal containing reverberant sounds collected in the listening room L when the sound generation point S having nondirectional characteristics generates an acoustic measurement signal such as an impulse sound.

The conventional reverberation applying apparatus does not always accurately reproduce acoustic fields in the acoustic space. For example, it is impossible to reproduce an acoustic field in which the performer plays a musical instrument having specific directivity such as a brass instrument.

SUMMARY OF THE INVENTION

The present invention has been made in consideration of the foregoing. It is therefore an object of the present invention to provide a reverberation applying apparatus, a reverberation applying method, an impulse response generation apparatus, an impulse response generation method, a reverberation applying program, an impulse response generation program, and a recording medium capable of more accurately reproducing acoustic fields in an acoustic space.

In order to achieve the above-mentioned object, the present invention provides a reverberation applying apparatus for applying a reverberation effect to an audio signal for reproduction of a sound in a desired acoustic space. The inventive apparatus comprises a space information acquisition section that acquires space information indicating a spatial shape of the acoustic space bordered by a boundary surface and an acoustic reflectivity of the boundary surface enclosing the acoustic space, a point information acquisition section that acquires point information indicating positions of a sound generation point set in the acoustic space as a point of generating the sound, and a sound reception point set in the acoustic space as a point of receiving the sound, an acoustic ray path estimation section that estimates a set of acoustic ray paths of the sound traveling from the sound generation point to the sound reception point through the acoustic space based on the acquired space information and the point information, a directivity information acquisition section that acquires directivity information indicating either of an acoustic generation directivity characterizing a directivity of the sound generation point in generating the sound, and an acoustic reception directivity characterizing a directivity of the sound reception point in receiving the sound, a weighting section that estimates each acoustic intensity of the sound around the sound reception point for each of the acoustic ray paths through which the sound travels to the sound reception point from the sound generation point, and weights each acoustic intensity by the acquired directivity information, an impulse response determination section that determines an impulse response of the acoustic space based on directions of the respective acoustic ray paths toward the sound reception point and the weighed acoustic intensities of the respective acoustic ray paths, and a convolution operation section that performs a convolution operation between the determined impulse response and the audio signal to apply thereto the reverberation effect specific to the acoustic space.

Under this configuration, the weighting means specifies a sound intensity at the sound reception point for each acoustic ray path specified by the acoustic ray path specification means. The weighting means weights the specified sound intensity in accordance with sound generation directivity of the sound generation point and sound reception directivity of the sound reception point. The impulse response specification means specifies an impulse response of the acoustic space according to a direction toward the sound reception point along each acoustic ray path and the weighted sound intensity. The convolution operation means performs a convolution operation between the specified impulse response and the audio signal.

In this manner, the reverberation applying apparatus according to the present invention specifies an impulse response corresponding to directivity of the sound generation point and the sound reception point. The convolution operation is performed between the impulse response and the audio signal. The audio signal acquired as a result of the convolution operation is supplied with a reverberant sound corresponding to the directivity of the sound generation point and the sound reception point. Even if a musical sound is reproduced from a musical instrument having directivity such as brass instruments, it is possible to reproduce an acoustic field reflecting the directivity and more accurately reproduce the acoustic field.

The above-mentioned reverberation applying apparatus may be provided with a storage section that previously storing an audio signal to be supplied with the acoustic effect. Further, there may be provided with a reception section that receiving the audio signal from an external apparatus via networks such as the Internet.

The above-mentioned reverberation applying apparatus may be configured so that either the sound generation point S or the sound reception point R provides uniform directivity, i.e., nondirectional characteristics. It may be preferable to use only the directional directivity for weighting.

In order to achieve the above-mentioned object, the present invention provides an impulse response generation apparatus capable of determining an impulse response for use in reproduction of a sound in a desired acoustic space. The inventive apparatus comprises a space information acquisition section that acquires space information indicating a spatial shape of the acoustic space bordered by a boundary surface and an acoustic reflectivity of the boundary surface enclosing the acoustic space, a point information acquisition section that acquires point information indicating positions of a sound generation point set in the acoustic space as a point of generating the sound, and a sound reception point set in the acoustic space as a point of receiving the sound, an acoustic ray path estimation section that estimates a set of acoustic ray paths of the sound traveling from the sound generation point to the sound reception point through the acoustic space based on the acquired space information and the point information, a directivity information acquisition section that acquires directivity information indicating either of an acoustic generation directivity characterizing a directivity of the sound generation point in generating the sound, and an acoustic reception directivity characterizing a directivity of the sound reception point in receiving the sound, a weighting section that estimates each acoustic intensity of the sound around the sound reception point for each of the acoustic ray paths through which the sound travels to the sound reception point from the sound generation point, and weights each acoustic intensity by the acquired directivity information, and an impulse response determination section that determines an impulse response of the acoustic space based on directions of the respective acoustic ray paths toward the sound reception point and the weighed acoustic intensities of the respective acoustic ray paths.

Under this configuration, the weighting means specifies a sound intensity at the sound reception point for each acoustic ray path specified by the acoustic ray path specification means. The weighting means weights the specified sound intensity in accordance with sound generation directivity of the sound generation point and sound reception directivity of the sound reception point. The impulse response specification means generates and outputs an impulse response of the acoustic space according to a direction toward the sound reception point along each acoustic ray path and the weighted sound intensity.

Consequently, the impulse response generation apparatus according to the present invention generates and outputs an impulse response in accordance with directivity of each of the sound generation point and the sound reception point. The impulse response is used for the reverberation applying apparatus that supplies reverberation in accordance with the impulse response.

BRIEF DESCRIPTION OF THE DRAWINGS

FIG. 4 schematically shows a configuration of a recipe file according to the embodiment of the present invention;

FIG. 6 schematically shows a configuration of an acoustic ray path information table according to the embodiment of the present invention;

FIG. 8 schematically shows a configuration of a composite sound ray vector table according to the embodiment of the present invention;

FIG. 9 explains reproduction channel information according to the embodiment of the present invention;

DETAILED DESCRIPTION OF THE INVENTION

Embodiments of the present invention will be described in further detail with reference to the accompanying drawings.

Figure 1:
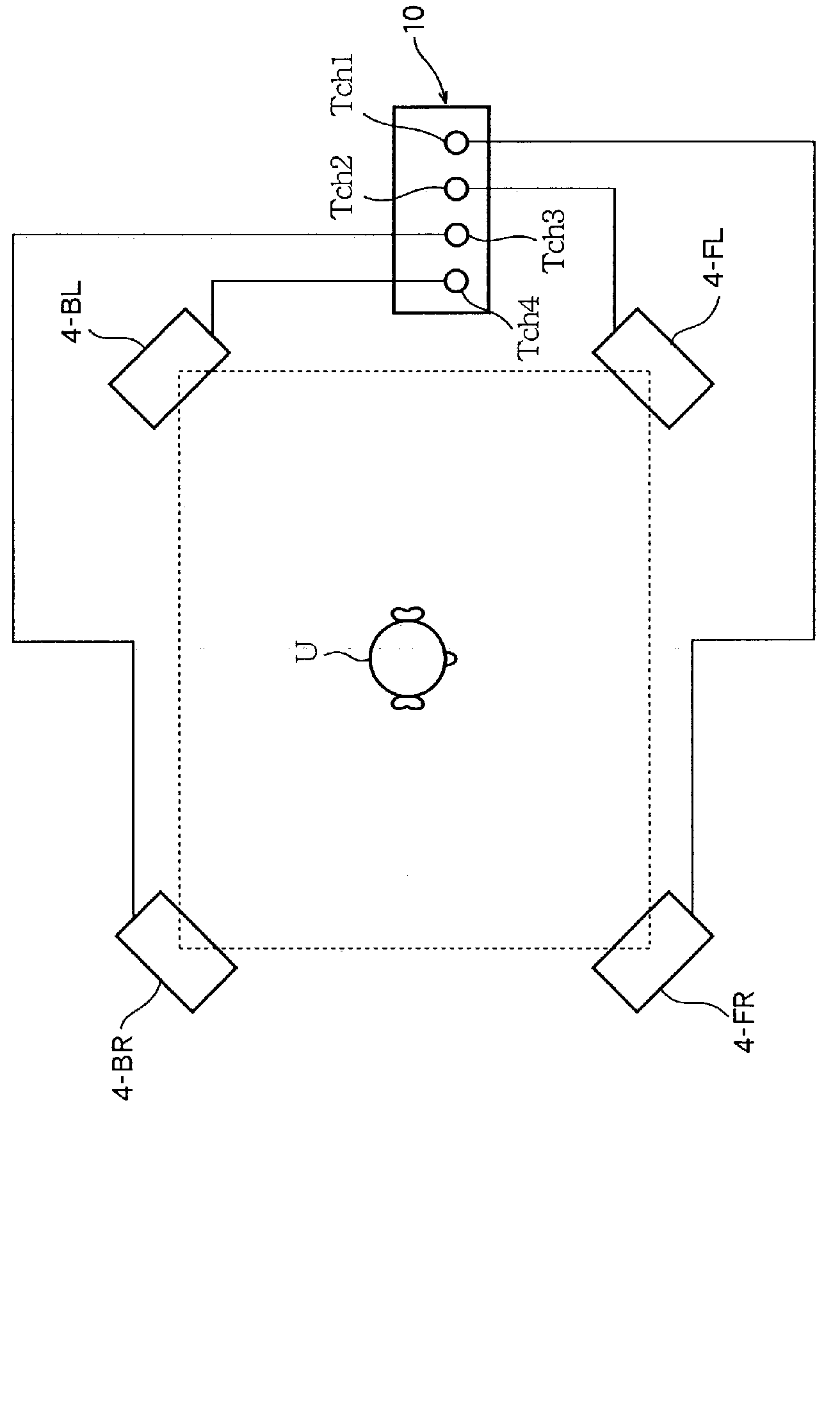
FIG. 1 schematically shows a form of using a reverberation applying apparatus according to an embodiment of the present invention.

FIG. 1 shows a form of using a reverberation applying apparatus 10 according to an embodiment of the present invention. In order to reproduce an acoustic field of the acoustic space, the reverberation applying apparatus 10 uses four reproduction channels to reproduce the sound reaching a listener U from four directions in the acoustic space. As shown in FIG. 1, the reverberation applying apparatus 10 is provided with four reproduction channel terminals Tch1 to Tch4. Each of the reproduction channel terminals Tch1 to Tch4 connects with each of four speakers 4 having almost the same performance. The four speakers 4 each are arranged with almost the same distance from the listener U. The description below uses the reference numerals 4-FR, 4-FL, 4-BR, and 4-BL to distinguish the speakers 4 from each other.

The reproduction channel terminal Tch1 connects with the speaker 4-FR that is arranged at the right front of the listener U (left front in the figure). The reproduction channel terminal Tch2 connects with the speaker 4-FL that is arranged at the left front of the listener U (right front in the figure). The speakers 4-FR and 4-FL generate sound reaching the listener U from the front in the acoustic space to be reproduced by the reverberation applying apparatus 10.

The reproduction channel terminal Tch3 connects with the speaker 4-BR that is arranged at the right rear of the listener U (left rear in the figure). The reproduction channel terminal Tch4 connects with the speaker 4-BL that is arranged at the left rear of the listener U (right rear in the figure). The speakers 4-BR and 4-BL generate sound reaching the listener U from the rear in the acoustic space to be reproduced by the reverberation applying apparatus 10.

Figure 2:
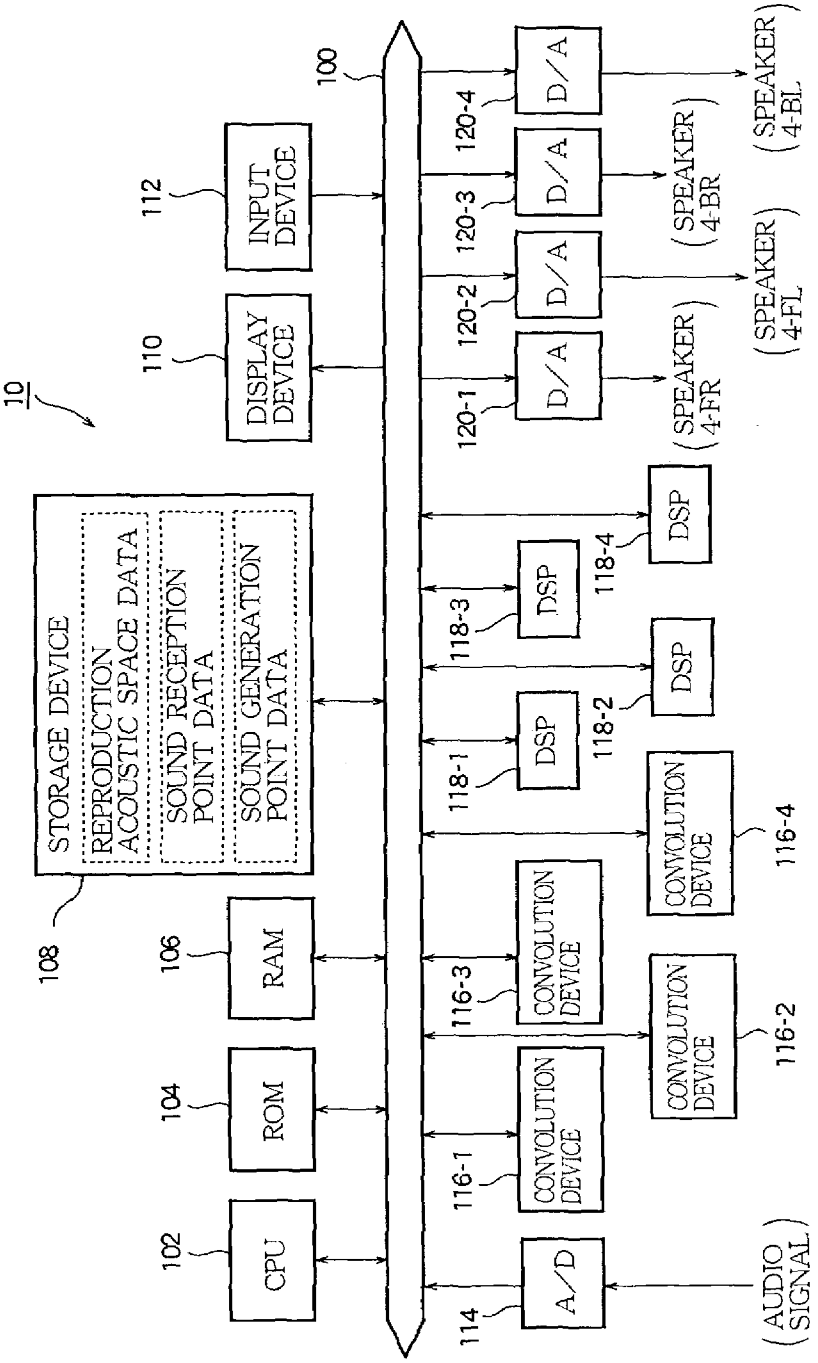
FIG. 2 is a block diagram showing an electrical configuration of the reverberation applying apparatus.

FIG. 2 shows an electrical configuration of the reverberation applying apparatus 10.

In FIG. 2, a CPU (Central Processing Unit) 102 controls operations of each section via a data address bus 100. ROM (Read Only Memory) 104 is rewritable nonvolatile memory such as EEPROM (Electrically Erasable Programmable ROM) and stores control programs executed by the CPU 102, programs for various processes, and various data. RAM (Random Access Memory) 106 is volatile memory and is used as a work area for the CPU 102 to temporarily store various operation results and data. A storage device 108 comprises storage media such as a hard disk, magnetic disk, magnetic optical disk, and optical disk, and stores the following data: reproduction acoustic space data, sound generation point data, and sound reception point data.

The reproduction acoustic space data is provided for each acoustic space such as a concert hall, a church, or a theater. One piece of reproduction acoustic space data contains space shape information and reflectivity. The space shape information indicates an acoustic space shape and is represented by coordinate information of the XYZ orthogonal coordinate system indicative of arrangement positions of a wall, ceiling, and floor. The reflectivity indicates sound reflectivity (absorption coefficient, sound reflection angle, etc.) of wall, ceiling, and floor materials in the acoustic space.

The sound generation point data is provided for a possible sound generation point S such as a piano, trumpet, and clarinet. One piece of sound generation point data contains directivity at the sound generation point S. The directivity at the sound generation point S indicates a sound generation intensity at the sound generation point S in each direction with respect to the sound generation point S. The sound reception point data is provided for each possible sound reception point R such as a human being and a microphone. One piece of sound reception point data contains directivity at the sound reception point R. The directivity at the sound reception point R indicates sound reception sensitivity at the sound reception point R in each direction with respect to the sound reception point R.

The storage device 108 stores a large amount of reproduction acoustic space data, sound generation point data, and sound reception point data so that a user can select an acoustic space or a musical instrument to be performed from several candidates. The storage device 108 may not be included in the reverberation applying apparatus 10, but may be an external storage device. The reverberation applying apparatus 10 need not always have the storage device 108. A networked server may be provided with the storage device 108. The reverberation applying apparatus 10 may be configured to have a communication means. Through the use of the communication means, it may be preferable to acquire various data stored in the storage device 108 from the server via the network.

In FIG. 2, a display device 110 corresponds to, e.g., a CRT (Cathode Ray Tube) display and displays various information under control of the CPU 102. More specifically, the display device 110 displays candidates for the acoustic space, sound generation point S, and sound reception point R. Further, the display device 110 displays a perspective view indicating a shape of the user-selected acoustic space.

An input device 112 corresponds to, e.g., a keyboard, a mouse, and a joystick, and outputs various user-input information to the CPU 102 via the data address bus 100. The user-input information includes not only a user-selected acoustic space and types of the sound generation point S, but also arrangement positions (coordinate information) for each of the sound generation point S and the sound reception point R in the acoustic space, directions of the sound generation point S and the sound reception point R, and the like. In more detail, when a user operates the input device 112 to select an acoustic space from several candidates, the input device 112 detects this operation and supplies the CPU 102 with selection information about the selected acoustic space. When receiving the selection information about the user-selected acoustic space, the CPU 102 reads reproduction acoustic space data corresponding to this acoustic space from the storage device 108, and then allows the display device 110 to display a perspective view indicating a shape of the acoustic space. Namely, the inventive reverberation applying apparatus has a storage device that stores a plurality of the space information representing a plurality of acoustic spaces of different types, and an input device that can be operated by a user to select a desired one of the acoustic spaces. Thus, the space information acquisition section retrieves the space information corresponding to the selected acoustic space from the storage device.

For example, the user operates the input device 112 to specify arrangement positions and directions of the sound generation point S and the sound reception point R in the perspective view displayed in the display device 110. At this time, the input device 112 detects such operation to provide the CPU 102 with coordinate information about each XYZ orthogonal coordinate system indicative of the arrangement positions and directions of the sound generation point S and the sound reception point R.

The CPU 102 calculates an impulse response in the acoustic space for each reproduction channel based on the reproduction acoustic space data, and the type, position, and direction of each of the sound generation point S and the sound reception point R. A procedure of calculating the impulse response will be described later in more detail.

An A/D converter 114 is supplied with an analog audio signal to be provided with an acoustic effect. The A/D converter 114 then converts the input analog audio signal into a digital audio signal. In order to prevent an unnecessary reverberant sound from being included during reproduction, it is preferable that the audio signal be that of a musical sound or a speech recorded in a dead space such as an unechoic chamber (i.e., dry source).

The storage device 108 may previously store waveform data for an audio signal to be provided with the acoustic effect. The reverberation applying apparatus 10 may further comprise a communication apparatus for interchanging data via the network. It may be preferable to receive waveform data for the audio signal from external apparatuses such as networked servers via the communication apparatus and provide the received waveform data with the acoustic effect.

The reverberation applying apparatus 10 comprises a convolution device 116-1 to 116-4, a DSP 118-1 to 118-4, and a D/A converter 120-1 to 120-4 for each reproduction channel in order to provide audio signals with different reverberation effects for each reproduction channel and reproduce the audio signals. The convolution device 116-1 realtime performs the real-time convolution for an impulse response to this apparatus from the CPU 102 and the digital signal from the A/D converter 114 and outputs a result to the DSP 118-1 via the data address bus 100. The convolution device may not be configured as the hardware, but may use a program to provide the CPU 102 with a function equivalent to the convolution device.

The DSP 118-1 processes the digital signal received from the convolution device 116-1 by performing various signal processes such as signal amplification, time delay, and frequency filtering and outputs the processed signal to the D/A converter via the data address bus 100.

The D/A converter 120-1 converts the digital signal received from the DSP 118-1 into an analog signal and outputs this signal to the speaker 4-FR connected to the reproduction channel terminal Tch1. The same applies to convolution devices 116-2 through 116-4, DSPs 118-2 through 118-4, and D/A converters 120-2 through 120-4 provided correspondingly to the other reproduction channels. While one convolution device and one DSP are provided for each reproduction channel, the present invention is not limited thereto. It may be preferable to configure one convolution device and one DSP to process audio signals for each reproduction channel. Further, it may be used multi-tap delay unit generally known in the art as the convolution devices 116-1 to 116-4.

In this configuration, the reverberation applying apparatus 10 provides the audio signal with a reverberation effect of the user-selected acoustic space and executes a process for reproducing the audio signal in accordance with a program stored in the ROM 104. This program is recorded on a computer-readable recording medium such as an optical disk, magnetic disk, and magnetic optical disk and is installed therefrom. The reverberation applying apparatus 10 may receive the program via the network. Namely, the inventive computer program is provided for use in a reverberation applying apparatus having a CPU. The program is executable by the CPU for causing the reverberation applying apparatus to perform a method of applying a reverberation effect to an audio signal for reproduction of a sound in a desired acoustic space. The method includes a first step of acquiring space information and point information, the space information indicating a spatial shape of the acoustic space bordered by a boundary surface and an acoustic reflectivity of the boundary surface enclosing the acoustic space, the point information indicating positions of a sound generation point set in the acoustic space as a point of generating the sound and a sound reception point set in the acoustic space as a point of receiving the sound, a second step of estimating a set of acoustic ray paths of the sound traveling from the sound generation point to the sound reception point through the acoustic space based on the acquired space information and the point information, a third step of acquiring directivity information indicating either of an acoustic generation directivity characterizing a directivity of the sound generation point in generating the sound, and an acoustic reception directivity characterizing a directivity of the sound reception point in receiving the sound, a fourth step of estimating each acoustic intensity of the sound around the sound reception point for each of the acoustic ray paths through which the sound travels to the sound reception point from the sound generation point, and weighting each acoustic intensity by the acquired directivity information, a fifth step of determining an impulse response of the acoustic space based on directions of the respective acoustic ray paths toward the sound reception point and the weighed acoustic intensities of the respective acoustic ray paths, and a sixth step of performing a convolution operation between the determined impulse response and the audio signal to apply thereto the reverberation effect specific to the acoustic space.

Figure 3:
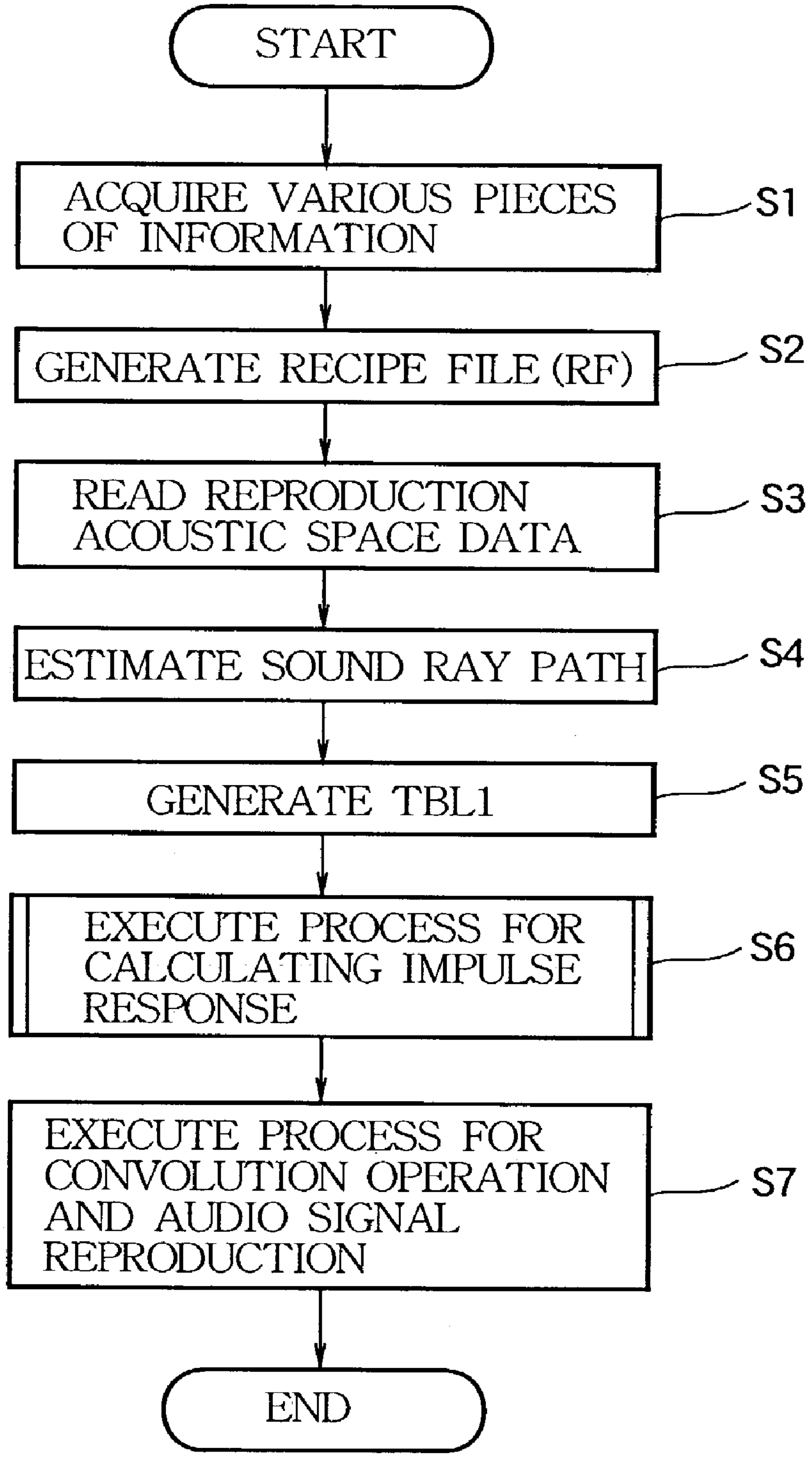
FIG. 3 is a flowchart showing a process executed by a CPU according to the embodiment of the present invention.

FIG. 3 is a flowchart showing an operational procedure of the reverberation applying apparatus 10. As shown in FIG. 3, the CPU 102 acquires pieces of information such as the user-selected acoustic space, the type of the sound generation point S, the arrangement position of the sound generation point S, the direction of the sound generation point S, the type of the sound reception point R, the arrangement position of the sound reception point R, and the direction of the sound reception point R from the input device 112 via the data address bus 100 (step S1). The CPU 102 then generates a recipe file RF (see FIG. 4) recording these pieces of information in the RAM 106 (step S2).

Figure 5:
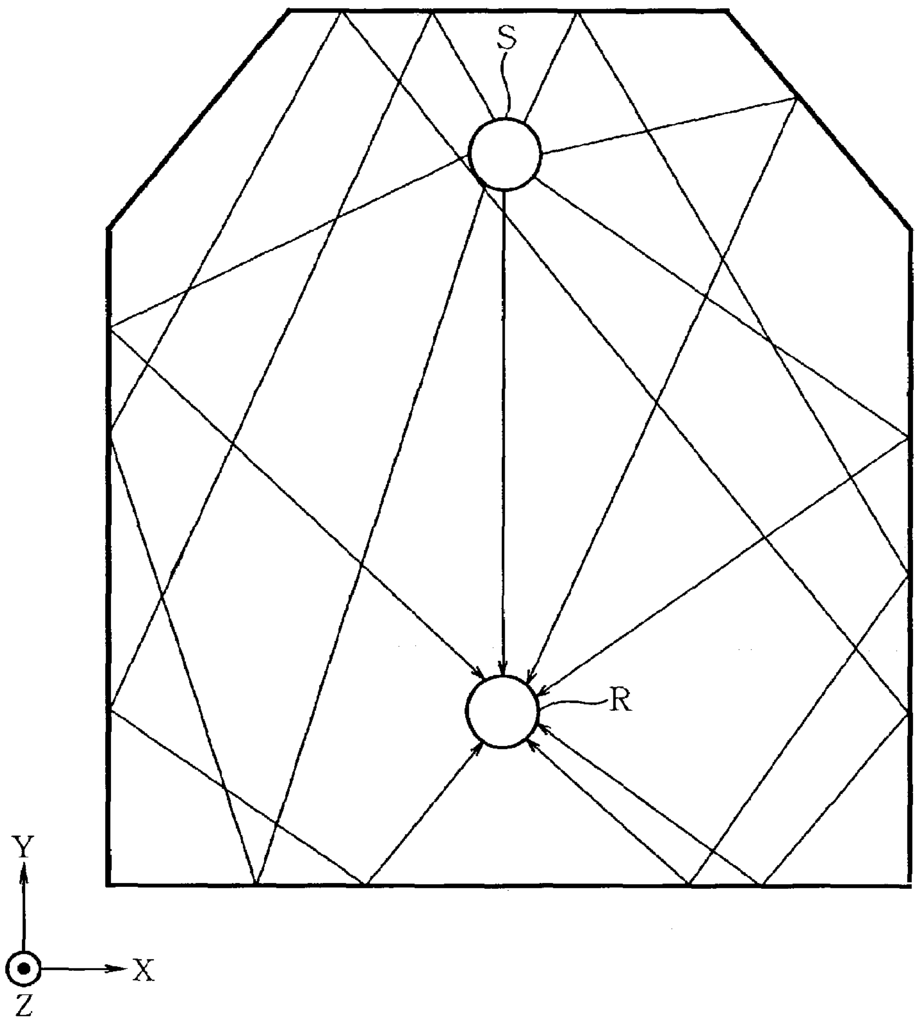
FIG. 5 schematically shows acoustic ray paths according to the embodiment of the present invention.

The CPU 102 then reads reproduction acoustic space data corresponding to the acoustic space recorded in the recipe file RF from the storage device 108 (step S3). The CPU 102 estimates an acoustic ray path traveled by a sound ray generated from the sound generation point S up to the sound reception point R (step S4) based on the space shape indicated by the reproduction acoustic space data and arrangement positions of the sound generation point S and the sound reception point R recorded in the recipe file RF according to the so-called ray tracing method that traces a path traveled by the sound generated from the sound generation point S. More specifically, the CPU 102 estimates an acoustic ray path assuming that the sound generation point S has nondirectional ray characteristics. The sound generation point S generates almost the same number of sounds in all directions. Some of these sounds reflect against the walls and the ceiling in the acoustic space and reach the sound reception point R. Paths of these sounds are estimated (see FIG. 5).

After estimating the acoustic ray paths, the CPU 102 sequentially generates records of acoustic ray paths from the shortest acoustic ray path length to create an acoustic ray path information table TBL1 (step S5).

FIG. 6 schematically shows a configuration of the acoustic ray path information table TBL1. As shown in FIG. 6, the acoustic ray path information table TBL1 contains a record generated for each estimated acoustic ray path. One record includes the acoustic ray path length, the generation direction, the reflection frequence, and the reflection attenuation rate Here, the acoustic ray path length represents the length of an acoustic ray path.

The generation direction indicates the direction of a sound generated from the sound generation point S and is represented by a vector in the XYZ orthogonal coordinate system. The arrival direction indicates the direction of a sound arriving at the sound reception point R and is represented by a vector in the same manner as the generation direction. The reflection frequence indicates the number of times the sound is reflected along its acoustic ray path against the walls, the ceiling, and the like in the acoustic space. The reflection attenuation rate denotes an attenuation factor of the sound due to a plurality of reflections indicated by the reflection frequence.

The CPU 102 then executes a process for calculating an impulse response (step S6).

Figure 7:
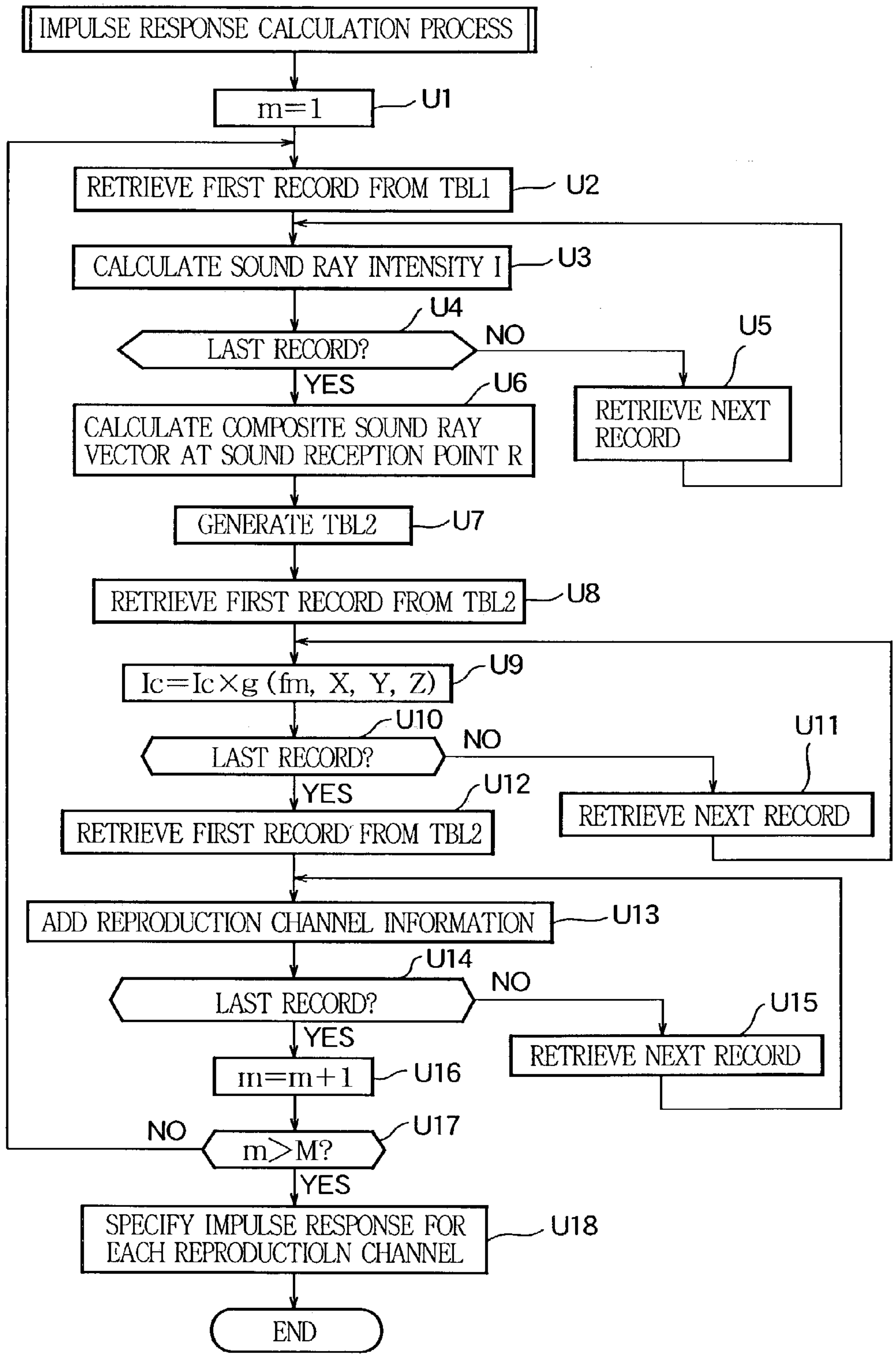
FIG. 7 is a flowchart showing an impulse response calculation process executed by the CPU according to the embodiment of the present invention.

FIG. 7 is a flowchart showing an impulse response calculation process executed by the CPU 102. Here, the impulse response calculation uses frequency-dependent parameters such as directivity of the sound generation point S. The CPU 102 divides a frequency band for the impulse response into bands causing an approximately constant parameter value and executes a process for calculating the impulse response for each band. The embodiment assumes that the frequency band for impulse responses is divided into M bands.

The CPU 102 first initializes a variable m for specifying the band to "1" (step U1). The CPU 102 then executes the following process to trace the acoustic ray path for each acoustic ray path and to find a sound ray intensity I of the sound that matches the sound reception point R. More specifically, the CPU 102 retrieves the first record from the acoustic ray path information table TBL1 (step U2). The CPU 102 then finds the sound ray intensity I for each acoustic ray path in a band fm according to the following equation (step U3) from the generation direction, the reflection attenuation rate, and the directivity indicated in the sound generation point data corresponding to the sound generation point S.

$$I=(r^2/L^2)\times\alpha(fm)\times d(fm, X, Y, Z)\times\beta(fm, L)$$

where r is the reference distance, L the acoustic ray path length, α(fm) the reflection attenuation rate, d(fm, X, Y, Z) the sounding directivity attenuation coefficient, and β(fm, L) the distance attenuation coefficient. The reference distance r is determined in accordance with the size of the acoustic space to be reproduced. More specifically, when the acoustic ray path length is sufficiently large with reference to the acoustic space size, the reference distance r is determined so as to increase the attenuation amount of the sound that travels the acoustic ray path. An operator "^" in the above-mentioned equation represents the power.

The reflection attenuation rate α(fm) is a sound decrement in accordance with the number of sound reflections against walls or the like in the acoustic space as mentioned above. Since the sound reflectance depends on the frequency of the sound to be reflected, the reflection attenuation rate is determined on a band basis.

The sounding directivity attenuation coefficient d(fm, X, Y, Z) is an attenuation coefficient in accordance with the directivity and the direction of the sound generation point S. In more detail, the sound generation point S contains the directivity of generating sounds with different intensities in respective directions. The directivity varies with a band of the sound to be generated. Accordingly, the CPU 102 corrects the directivity of the sound generation point S based on the direction of the sound generation point S to find the sounding directivity attenuation coefficient d(fm, X, Y, Z). The CPU 102 weights the value of the sounding directivity attenuation coefficient d(fm, X, Y, Z) corresponding to the direction from the sound generation point S with the sound ray intensity I to find the sound ray intensity I for each acoustic ray path corresponding to the directivity and the direction of the sound generation point S.

The distance attenuation coefficient β(fm, L) represents an attenuation for each band corresponding to the sound travel distance (path length).

The CPU 102 then determines whether or not the record processed at step U3 is the last record (step U4). If the result is "NO", the CPU 102 retrieves the next record from the acoustic ray path information table TBL1 (step U5) and returns the process to step U3 to find the sound ray intensity I for an acoustic ray path stored in this record.

If the result at step U4 is "YES", the CPU 102 extracts acoustic ray paths causing the same time interval for arrival at the sound reception point R (i.e., reverberation delay time). The CPU 102 then finds a composite sound ray vector of each acoustic ray path at the sound reception point R from an arrival direction vector and the sound ray intensity I of the acoustic ray path. More specifically, if the acoustic ray paths have acoustic ray path lengths equal to each other, the same time interval is needed for sounds to travel the corresponding acoustic ray paths to reach the sound reception point R. Hence, the CPU 102 extracts records having the same acoustic ray path length from the acoustic ray path information table TBL1 and finds a composite sound ray vector from the arrival direction and the sound ray intensity contained in each record.

The CPU 102 then creates a composite sound ray vector table TBL2 from the composite sound ray vector found at step U6 (step U7).

FIG. 8 schematically shows a configuration of the composite sound ray vector table TBL2.

As shown in FIG. 8, the composite sound ray vector table TBL2 contains a record for each composite sound ray vector found at step U6. One record comprises a reverberation delay time, a composite sound ray intensity Ic, and a composite arrival direction.

The reverberation delay time indicates a time interval required for the sound indicated by the composite sound ray vector to travel from the sound generation point S to the sound reception point R. The composite sound ray intensity Ic indicates an intensity of the composite sound ray vector. The composite arrival direction indicates a direction of the synthesized sound ray when it reaches the sound reception point R. The composite arrival direction is represented by a direction of the composite sound ray vector.

The CPU 102 then executes the following process to weight the composite sound ray intensity Ic of each composite sound ray vector found at step U6 with the directivity and the direction at the sound reception point R. That is to say, the CPU 102 retrieves the first record from the composite sound ray vector table TBL2 (step U8).

The CPU 102 multiplies the record's composite sound ray intensity by a sound reception directivity attenuation coefficient g(fm, X, Y, Z) (step U9), and then overwrites a result to the corresponding composite sound ray intensity in the composite sound ray vector table TBL2. The sound reception directivity attenuation coefficient g(fm, X, Y, Z) corresponds to the directivity and the direction at the sound reception point R.

In more detail, the sound reception point R provides different sound reception sensitivities depending on directions. The sound reception directivity varies with bands of the sound to be received. The CPU 102 corrects the directivity of the sound reception point R according to the direction at the sound reception point R to find the sound reception directivity attenuation coefficient g(fm, X, Y, Z). In accordance with the arrival direction of the composite sound ray vector toward the sound reception point R, the CPU 102 multiplies the sound reception directivity attenuation coefficient g(fm, X, Y, Z) and a sound ray vector intensity to find a composite sound ray vector intensity corresponding to the directivity and direction of the sound reception point R.

The CPU 102 then determines whether or not the record processed at step U9 is the last record in the composite sound ray vector table TBL2 (step U10). If the result is "NO", the CPU 102 retrieves the next record (step U11) and returns the process to step U9 to weight the composite sound ray intensity Ic for this record.

If the result at step U10 is "YES", the CPU 102 executes a process for each composite sound ray vector to determine which of four speakers 4 outputs a sound corresponding to the composite sound ray vector and assign this vector to each speaker. 4. Namely, the inventive reverberation applying apparatus has an output device that sounds the audio signal through a plurality of sounding channels spatially arranged to sound concurrently. Thus, the impulse response determination section determines a plurality of impulse responses in correspondence to the plurality of the sounding channels based on the spatial arrangement of the sounding channels, and the convolution operation section convolutes the audio signal with each of the impulse responses and feeds the respective convoluted audio signals to the respective sounding channels.

More specifically, the CPU 102 retrieves the first record from the composite sound ray vector table TBL2 (step U12). According to the composite arrival direction, the CPU 102 determines which of the four speakers 4 should output a sound corresponding to the composite sound ray vector stored in the record, i.e., to which of the four reproduction channels the sound should be assigned. The CPU 102 adds the reproduction channel information indicative of this determination result to the record (step U13). For example, the composite arrival direction in the retrieved record may indicate arrival from the right front to the sound reception point R. In this case, the sound corresponding to the composite sound ray vector needs to be output from the speaker 4-FR arranged to the right front of the listener U. For this purpose, the CPU 102 provides the reproduction channel information indicative of the reproduction channel corresponding to the speaker 4-FR (see FIG. 9). When the arrival direction of the composite sound ray vector corresponds to the front, for example, it just needs to provide the reproduction channel information for generating the same sound volume from the speakers 4-FR and 4-FL as reproduction channels.

The CPU 102 then determines whether or not the retrieved record is the last record in the composite sound ray vector table TBL2 (step U14). If the result is "NO", the CPU 102 retrieves the next record (step U15) and returns the process to step U13 to process this record.

If the result at step U4 is "YES", the CPU 102 increments the variable m by "1" (step U16) and determines whether or not the variable is greater than a division count M for the frequency band (step U17). If the result is "NO", the CPU 102 returns the process to step U2 to find an impulse response for the next band. If the result at step U17 is "YES", the CPU 102 finds an impulse response for each reproduction channel from the composite sound ray intensity Ic found for each band (step U18).

More specifically, the CPU 102 references the reproduction channel information provided at step U13. The CPU 102 then extracts records for the composite sound ray vector assigned to the same reproduction channel from composite sound ray vector table TBL2 generated for each band. The CPU 102 finds impulse sounds collected at the sound reception point R on a time-series basis to specify an impulse response according to reverberation delay times and synthesized sound ray intensities of the extracted records. This specifies the impulse response for each reproduction channel. Namely, in the inventive reverberation applying apparatus, the impulse response determination section computes time intervals of the respective acoustic ray paths between the sound reception point and the sound generation point, and produces a time-series of the acoustic ray paths in terms of the computed time intervals, so that the weighed acoustic intensities of the acoustic ray paths determine a waveform of the impulse response along a time axis.

Upon completion of the impulse response calculation process (step S6) as shown in FIG. 3, the CPU 102 allows each of the convolution devices 116-1 through 116-4 to perform a convolution operation between the impulse response and the audio signal for executing a process for reproducing the audio signal (step S7). That is to say, the CPU 102 outputs impulse responses for the reproduction channels corresponding to the convolution devices 116-1 through 116-4 and outputs a command signal for performing a convolution operation between the impulse response and the audio signal.

Figure 10:
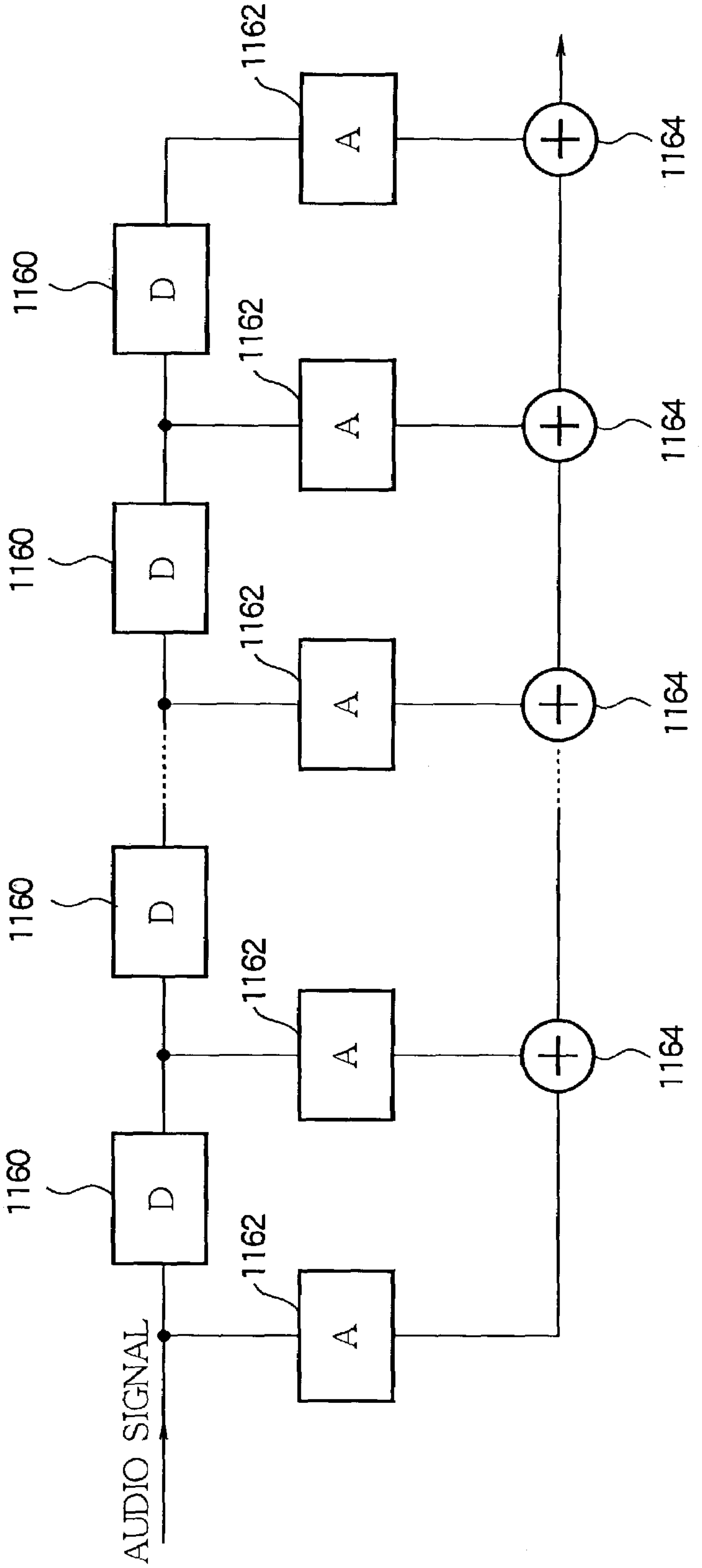
FIG. 10 schematically shows a convolution operation processing block according to the embodiment of the present invention.
Figure 11:
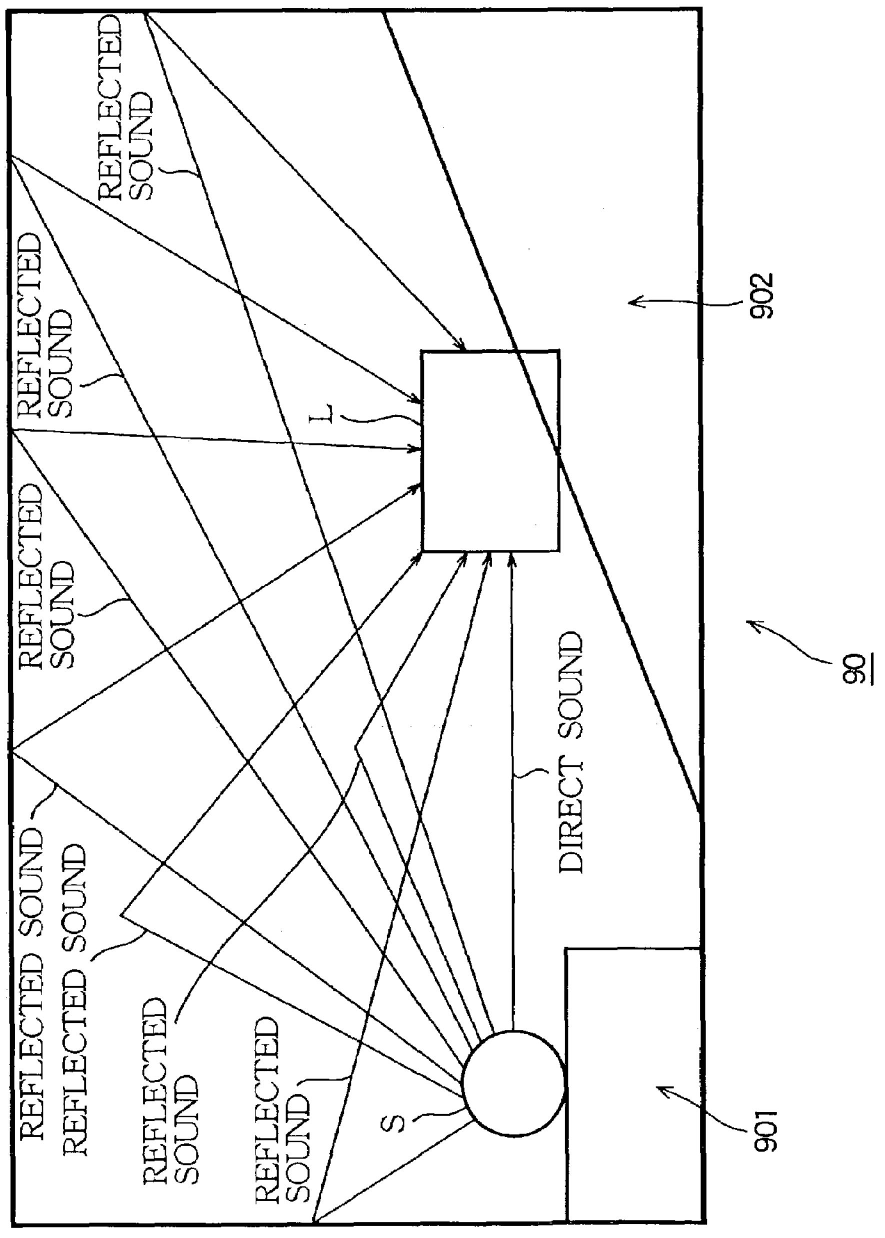
FIG. 11 illustrates a conventional acoustic field reproduction technique.

Upon reception of the command signal from the CPU 102, the convolution devices 116-1 through 116-4 receive the digital audio signal from the A/D converter 114 and perform a convolution operation between the audio signal and the impulse response received from the CPU 102. FIG. 10 schematically shows a convolution operation processing block for the convolution devices 116-1 through 116-4. As shown in FIG. 10, the convolution operation processing block comprises many delay circuits 1160, multiplier circuits 1162, and adder circuits 1164. The delay circuit 1160 provides an audio signal with a given time delay. The multiplier circuit 1162 multiplies the audio signal and a coefficient corresponding to each pulse for the impulse response received from the CPU 102. The adder circuit 1164 adds audio signals to each other output from the multiplier circuits 1162. In this configuration, reverberant sound components corresponding to one impulse response are generated in such a manner that the audio signal passes the number of delay circuits 1160 corresponding to the reverberation delay time and also passes the multiplier circuits 1162 corresponding to the impulse response. The convolution operation processing block adds the reverberant sound components to provide the audio signal with the reverberation effect.

The convolution devices 116-1 through 116-4 then output the operation results to the DSPs 118-1 through 118-4, respectively. The DSPs 118-1 through 118-4 apply various signal processes to the received digital audio signal and output the signal to the D/A converters 120-1 through 120-4, respectively. The D/A converter 120-1 through 120-4 convert the received digital audio signal into an analog audio signal and output it to the corresponding speakers 4. The respective speakers 4 output sounds corresponding to the received audio signal.

The composite sound ray intensity of the composite sound ray vector is found in accordance with four elements, i.e., the directivity and the direction at the sound generation point S and the directivity and the direction at the sound reception point R. The composite sound ray vector specifies an impulse response for each reproduction channel. That is to say, the specified impulse response reflect four elements. The impulse response is convoluted with the audio signal, reproducing an audio signal acquired as a convolution operation result. When the reverberation applying apparatus 10 reproduces an audio signal of the musical sound, it reproduces states of listening to the musical sound performed on the stage at a seat in the audience including musical instruments' directivity and performers' directions. In other words, the reproduced acoustic field represents differences between musical instruments having different directivity such as a trumpet, a violin, a flute, and a piano. Further, differences in performance conditions are expressed in such a manner that the sound strongly reflects on a wall when the performer plays facing the wall; it weakly reflects on the wall when the performer plays with his or her back to the wall. As mentioned above, the reverberation applying apparatus 10 according to the embodiment can accurately reproduce the acoustic field.

The reverberation applying apparatus 10 according to the embodiment can always provide acoustic ray paths equal to each other acquired as a result of the acoustic ray path estimation at step S4 (see FIG. 3) if no change is made to arrangement positions among the acoustic space, the sound generation point S, and the sound reception point R. When the storage device 108 or the like stores the estimated acoustic ray paths, the acoustic ray path estimation at step S4 need not be reexecuted if a change is made to information other than the arrangement positions among the acoustic space, the sound generation point S, and the sound reception point R. This makes it possible to shorten the process time until the impulse response is specified. The embodiment has exemplified the reverberant sound supply apparatus configured to reproduce sounds in an acoustic space by generating an impulse response and using the impulse response to output sounds. Further, it may be preferable to configure different apparatuses for generating an impulse response and supplying a reverberant sound in such a manner that the impulse response generation apparatus generates an impulse response and the reverberation applying apparatus provides a reverberant sound using the impulse response. The embodiment may be configured so that either the sound generation point S or the sound reception point R provides uniform directivity, i.e., nondirectional characteristics. It may be preferable to use only the directional directivity for weighting.

MODIFICATIONS

The above-mentioned embodiment just shows a form of the present invention. It is further understood by those skilled in the art that various changes and modifications may be made in the present invention without departing from the spirit and scope thereof. The following describes various modifications of the embodiment.

(Modification 1)

While the reverberation applying apparatus 10 according to the above-mentioned embodiment has four reproduction channels, it is optional as to the number of reproduction channels to be provided. While the embodiment uses the XYZ orthogonal coordinate system for describing various types of coordinate information, any coordinate systems may be used.

(Modification 2)

According to the above-mentioned embodiment, the storage device 108 in the reverberation applying apparatus 10 previously stores a plurality of reproduction acoustic space data corresponding to acoustic spaces such as a concert hall. A user selects an acoustic space to be reproduced out of the stored acoustic spaces. The present invention is not limited thereto. The embodiment may be modified so that the user can design any acoustic space and the reverberation applying apparatus 10 can provide the audio signal with a reverberation effect of the designed acoustic space. Further, the embodiment may be modified so that the user can freely adjust directivity of the sound generation point S and the sound reception point R. Namely, the inventive reverberation applying apparatus has a display device that displays the selected acoustic space, such that the user can operate the input device to visually modify the spatial shape of the selected acoustic space on the display device and to set either of the sound generation point and the sound reception point in the acoustic space.

(Modification 3)

While the above-mentioned embodiment provides only one sound generation point S, the present invention is not limited thereto. The embodiment may be modified so that a plurality of sound generation points S is provided. Moreover, the embodiment may be modified so that a plurality of sound reception points R is provided. When there are provided a plurality of sound generation points S and a plurality of sound reception points R, the CPU 102, at step S4 in FIG. 3, estimates an acoustic ray path traveled by an impulse sound from one sound generation point S up to each sound reception point R for each sound generation point S3. Namely, in the inventive reverberation applying apparatus, the point information acquisition section acquires the point information indicating that either of the sound generation point and the sound reception point are set multiple, and the acoustic ray path estimation section estimates each set of acoustic ray paths of the sound traveling from each sound generation point to each sound reception point, so that the impulse response determination section determines a total impulse response of the acoustic space involving a multiple of the sound generation points or a multiple of the sound reception points.

(Modification 4)

According to the above-mentioned embodiment, the sound generation point S is fixed to the arranged position and direction. Furthermore, the embodiment may be modified so that the reverberation applying apparatus 10 finds an impulse response in accordance with changes in the arrangement position and direction of the sound generation point S. This modification reproduces an acoustic field in which, for example, a performer moves on the stage by playing a musical instrument. Namely, in the inventive reverberation applying apparatus, the point information acquisition section periodically acquires the point information while either of the sound generation point and the sound reception point may move in the acoustic space, and the acoustic ray path estimation section updates the acoustic ray paths of the sound traveling from the sound generation point to the sound reception point each time the point information is acquired, so that the impulse response determination section re-determines the impulse response each time the acoustic ray paths are updated for dynamic reproduction of the sound responsive to movement of either of the sound generation point and the sound reception point.

As mentioned above, the present invention provides the reverberation applying apparatus, the reverberation applying method, the impulse response generation apparatus, the impulse response generation method, the reverberation applying program, the impulse response generation program, and the recording medium capable for more accurately reproducing acoustic fields in the acoustic space.

What is claimed is:

1. A reverberation applying apparatus for applying a reverberation effect to an audio signal for reproduction of a sound in a desired acoustic space, the apparatus comprising:

a space information acquisition section that acquires space information indicating a spatial shape of the acoustic space bordered by a boundary surface and an acoustic reflectivity of the boundary surface enclosing the acoustic space;

a point information acquisition section that acquires, point information indicating a type, a direction, and a position of a sound generation point set in the acoustic space as a point of generating the sound, and a type, a direction, and a position of a sound reception point set in the acoustic space as a point of receiving the sound, wherein the type of the sound generation point indicates a specific type of musical instrument, and wherein the type of a sound reception point indicates one of a human and a non-human type of sound reception point;

an acoustic ray path estimation section that estimates a set of acoustic ray paths of the sound traveling from the sound generation point to the sound reception point through the acoustic space based on the acquired space information and the point information;

a directivity information acquisition section that acquires directivity information indicating an acoustic generation directivity characterizing a directivity of the sound generation point in generating the sound, and an acoustic reception directivity characterizing a directivity of the sound reception point in receiving the sound;

a weighting section that estimates each acoustic intensity of the sound around the sound reception point for each of the acoustic ray paths through which the sound travels to the sound reception point from the sound generation point, and weights each acoustic intensity based on the acquired directivity information and the acquired point information indicating the direction of the sound generation point and the direction of the sound reception point;

an impulse response determination section that determines an impulse response of the acoustic space based on directions of the respective acoustic ray paths toward the sound reception point and the weighed acoustic intensities of the respective acoustic ray paths; and a convolution operation section that performs a convolution operation between the determined impulse response and the audio signal to apply thereto the reverberation effect specific to the acoustic space.

2. The reverberation applying apparatus according to claim 1, wherein the point information acquisition section periodically acquires the point information while either of the sound generation point and the sound reception point may move in the acoustic space, and the acoustic ray path estimation section updates the acoustic ray paths of the sound traveling from the sound generation point to the sound reception point each time the point information is acquired, so that the impulse response determination section re-determines the impulse response each time the acoustic ray paths are updated for dynamic reproduction of the sound responsive to movement of either of the sound generation point and the sound reception point.

3. The reverberation applying apparatus according to claim 1, wherein the point information acquisition section acquires the point information indicating that either of the sound generation point and the sound reception point are set multiple, and the acoustic ray path estimation section estimates each set of acoustic ray paths of the sound traveling from each sound generation point to each sound reception point, so that the impulse response determination section determines a total impulse response of the acoustic space involving a multiple of the sound generation points or a multiple of the sound reception points.

4. The reverberation applying apparatus according to claim 1, further comprising an output device that sounds the audio signal through a plurality of sounding channels spatially arranged to sound concurrently, wherein the impulse response determination section determines a plurality of impulse responses in correspondence to the plurality of the sounding channels based on the spatial arrangement of the sounding channels, and the convolution operation section convolutes the audio signal with each of the impulse responses and feeds the respective convoluted audio signals to the respective sounding channels.

5. The reverberation applying apparatus according to claim 1, further comprising a storage device that stores a plurality of the space information representing a plurality of acoustic spaces of different types, and an input device that can be operated by a user to select a desired one of the acoustic spaces, wherein the space information acquisition section retrieves the space information corresponding to the selected acoustic space from the storage device.

6. The reverberation applying apparatus according to claim 5, further comprising a display device that displays the selected acoustic space, such that the user can operate the input device to visually modify the spatial shape of the selected acoustic space on the display device and to set either of the sound generation point and the sound reception point in the acoustic space.

7. The reverberation applying apparatus according to claim 1, wherein the impulse response determination section computes time intervals of the respective acoustic ray paths between the sound reception point and the sound generation point, and produces a time-series of the acoustic ray paths in terms of the computed time intervals, so that the weighed acoustic intensities of the acoustic ray paths determine a waveform of the impulse response along a time axis.

8. An impulse response determining apparatus capable of determining an impulse response for use in reproduction of a sound in a desired acoustic space, the apparatus comprising:

a space information acquisition section that acquires space information indicating a spatial shape of the acoustic space bordered by a boundary surface and an acoustic reflectivity of the boundary surface enclosing the acoustic space;

a point information acquisition section that acquires point information indicating a type, a direction, and a position of a sound generation point set in the acoustic space as a point of generating the sound, and a type, a direction, and a position of a sound reception point set in the acoustic space as a point of receiving the sound, wherein the type of the sound generation point indicates a specific type of musical instrument, and wherein the type of a sound reception point indicates one of a human and a non-human type of sound reception point;

an acoustic ray path estimation section that estimates a set of acoustic ray paths of the sound traveling from the sound generation point to the sound reception point through the acoustic space based on the acquired space information and the point information;

a directivity information acquisition section that acquires directivity information indicating either of an acoustic generation directivity characterizing a directivity of the sound generation point in generating the sound, and an acoustic reception directivity characterizing a directivity of the sound reception point in receiving the sound;

a weighting section that estimates each acoustic intensity of the sound around the sound reception point for each of the acoustic ray paths through which the sound travels to the sound reception point from the sound generation point, and weights each acoustic intensity by the acquired directivity information; and an impulse response determination section that determines an impulse response of the acoustic space based on directions of the respective acoustic ray paths toward the sound reception point and the weighed acoustic intensities of the respective acoustic ray paths.

9. A reverberation applying method of applying a reverberation effect to an audio signal for reproduction of a sound in a desired acoustic space, the method comprising:

a first step of acquiring space information and point information, the space information indicating a spatial shape of the acoustic space bordered by a boundary surface and an acoustic reflectivity of the boundary surface enclosing the acoustic space, the point information indicating positions of a sound generation point set in the acoustic space as a point of generating the sound and a sound reception point set in the acoustic space as a point of receiving the sound, wherein the type of the sound generation point indicates a specific type of musical instrument, and wherein the type of a sound reception point indicates one of a human and a non-human type of sound reception point;

a second step of estimating a set of acoustic ray paths of the sound traveling from the sound generation point to the sound reception point through the acoustic space based on the acquired space information and the point information;

a third step of acquiring directivity information indicating either of an acoustic generation directivity characterizing a directivity of the sound generation point in generating the sound, and an acoustic reception directivity characterizing a directivity of the sound reception point in receiving the sound;

a fourth step of estimating each acoustic intensity of the sound around the sound reception point for each of the acoustic ray paths through which the sound travels to the sound reception point from the sound generation point, and weighting each acoustic intensity by the acquired directivity information;

a fifth step of determining an impulse response of the acoustic space based on directions of the respective acoustic ray paths toward the sound reception point and the weighed acoustic intensities of the respective acoustic ray paths; and a sixth step of performing a convolution operation between the determined impulse response and the audio signal to apply thereto the reverberation effect specific to the acoustic space.

10. An impulse response determining method of determining an impulse response for use in reproduction of a sound in a desired acoustic space, the method comprising:

a first step of acquiring space information and point information, the space information indicating a spatial shape of the acoustic space bordered by a boundary surface and an acoustic reflectivity of the boundary surface enclosing the acoustic space, the point information indicating a type, a direction, and a position of a sound generation point set in the acoustic space as a point of generating the sound, and a type, a direction, and a position of a sound reception point set in the acoustic space as a point of receiving the sound, wherein the type of the sound generation point indicates a specific type of musical instrument, and wherein the type of a sound reception point indicates one of a human and a non-human type of sound reception point;

a second step of estimating a set of acoustic ray paths of the sound traveling from the sound generation point to the sound reception point through the acoustic space based on the acquired space information and the point information;

a third step of acquiring directivity information indicating either of an acoustic generation directivity characterizing a directivity of the sound generation point in generating the sound, and an acoustic reception directivity characterizing a directivity of the sound reception point in receiving the sound;

a fourth step of estimating each acoustic intensity of the sound around the sound reception point for each of the acoustic ray paths through which the sound travels to the sound reception point from the sound generation point, and weighting each acoustic intensity by the acquired directivity information; and a fifth step of determining an impulse response of the acoustic space based on directions of the respective acoustic ray paths toward the sound reception point and the weighed acoustic intensities of the respective acoustic ray paths.

11. A machine readable medium for use in a reverberation applying apparatus having a CPU, the medium containing a program executable by the CPU for causing the reverberation applying apparatus to perform a method of applying a reverberation effect to an audio signal for reproduction of a sound in a desired acoustic space, wherein the method comprises:

a first step of acquiring space information and point information, the space information indicating a spatial shape of the acoustic space bordered by a boundary surface and an acoustic reflectivity of the boundary surface enclosing the acoustic space, the point information indicating a type, a direction, and a position of a sound generation point set in the acoustic space as a point of generating the sound, and a type, a direction, and a position of a sound reception point set in the acoustic space as a point of receiving the sound, wherein the type of the sound generation point indicates a specific type of musical instrument, and wherein the type of a sound reception point indicates one of a human and a non-human type of sound reception point;

a second step of estimating a set of acoustic ray paths of the sound traveling from the sound generation point to the sound reception point through the acoustic space based on the acquired space information and the point information;

a third step of acquiring directivity information indicating either of an acoustic generation directivity characterizing a directivity of the sound generation point in generating the sound, and an acoustic reception directivity characterizing a directivity of the sound reception point in receiving the sound;

a fourth step of estimating each acoustic intensity of the sound around the sound reception point for each of the acoustic ray paths through which the sound travels to the sound reception point from the sound generation point, and weighting each acoustic intensity by the acquired directivity information;

a fifth step of determining an impulse response of the acoustic space based on directions of the respective acoustic ray paths toward the sound reception point and the weighed acoustic intensities of the respective acoustic ray paths; and a sixth step of performing a convolution operation between the determined impulse response and the audio signal to apply thereto the reverberation effect specific to the acoustic space.

12. A machine readable medium for use in an impulse response determining apparatus having a CPU, the medium containing a program executable by the CPU for causing the impulse response determining apparatus to perform a method of determining an impulse response for use in reproduction of a sound in a desired acoustic space, wherein the method comprises:

a first step of acquiring space information and point information, the space information indicating a spatial shape of the acoustic space bordered by a boundary surface and an acoustic reflectivity of the boundary surface enclosing the acoustic space, the point information indicating a type, a direction, and a position of a sound generation point set in the acoustic space as a point of generating the sound, and a type, a direction, and a position of a sound reception point set in the acoustic space as a point of receiving the sound, wherein the type of the sound generation point indicates a specific type of musical instrument, and wherein the type of a sound reception point indicates one of a human and a non-human type of sound reception point;

a second step of estimating a set of acoustic ray paths of the sound traveling from the sound generation point to the sound reception point through the acoustic space based on the acquired space information and the point information;

a third step of acquiring directivity information indicating either of an acoustic generation directivity characterizing a directivity of the sound generation point in generating the sound, and an acoustic reception directivity characterizing a directivity of the sound reception point in receiving the sound;

a fourth step of estimating each acoustic intensity of the sound around the sound reception point for each of the acoustic ray paths through which the sound travels to the sound reception point from the sound generation point, and weighting each acoustic intensity by the acquired directivity information; and a fifth step of determining an impulse response of the acoustic space based on directions of the respective acoustic ray paths toward the sound reception point and the weighed acoustic intensities of the respective acoustic ray paths.

* * * * *